US007420859B2

(12) United States Patent  
Nautiyal

(10) Patent No.: US 7,420,859 B2
(45) Date of Patent: Sep. 2, 2008

(54) MEMORY DEVICE AND METHOD OF CONTROLLING ACCESS TO SUCH A MEMORY DEVICE

(75) Inventor: Vivek Nautiyal, Uttranchal (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 11/635,086

(22) Filed: Dec. 7, 2006

(65) Prior Publication Data

US 2008/0141067 A1    Jun. 12, 2008

(51) Int. Cl.
G11C 7/00 (2006.01)
G11C 17/18 (2006.01)
G11C 8/00 (2006.01)

(52) U.S. Cl. ............. 365/200; 365/225.7; 365/230.03
(58) Field of Classification Search ............ 365/200, 365/201, 225.7, 230.03, 185.09, 185.11
See application file for complete search history.

(56) References Cited

U.S. PATENT DOCUMENTS

| | | | | | |
|---|---|---|---|---|---|
| 5,153,880 | A | * | 10/1992 | Owen et al. | 365/200 |
| 5,297,086 | A | * | 3/1994 | Nasu et al. | 365/200 |
| 5,774,396 | A | * | 6/1998 | Lee et al. | 365/185.09 |
| 5,920,515 | A | * | 7/1999 | Shaik et al. | 365/200 |
| 6,011,734 | A | * | 1/2000 | Pappert | 365/200 |
| 6,021,512 | A | * | 2/2000 | Lattimore et al. | 365/201 |
| 6,181,614 | B1 | * | 1/2001 | Aipperspach et al. | 365/200 |
| 6,567,323 | B2 | * | 5/2003 | Pitts et al. | 365/200 |
| 6,618,306 | B2 | * | 9/2003 | Bohm et al. | 365/230.03 |
| 6,728,910 | B1 | * | 4/2004 | Huang | 365/200 |
| 7,120,068 | B2 | * | 10/2006 | Lakhani et al. | 365/200 |

* cited by examiner

Primary Examiner—Trong Phan
(74) Attorney, Agent, or Firm—Nixon & Vanderhye P.C.

(57) ABSTRACT

The present invention provides a memory device comprising a memory array having a plurality of memory regions, and a plurality of data path access units, each data path access unit being associated with at least one memory region. Each memory region has at least one associated memory region selected such that the data path access unit used for that memory region is different to the data path access unit used for the at least one associated memory region. For each memory region, any redundant row used in place of a faulty row in that memory region is provided in the at least one associated memory region, and a storage is provided for maintaining a record identifying each faulty row and the redundant row to be used in place of that faulty row. On receipt of a read access request specifying a read address, a lookup operation is performed in both the memory region identified by that read address and the at least one associated memory region. Further, a comparison operation is performed to determine with reference to the storage whether the read address corresponds to one of the faulty rows as identified in the record. If the comparison operation determines that the read address does not correspond to one of the faulty rows, then the read data obtained from the memory region identified by the read address is output, whereas otherwise the read data obtained from the identified redundant row in the associated memory region is output.

14 Claims, 6 Drawing Sheets

MEMORY DEVICE AND METHOD OF CONTROLLING ACCESS TO SUCH A MEMORY DEVICE

BACKGROUND OF THE INVENTION

1. Field of the Invention

The present invention relates to a memory device and to a method of controlling access to such a memory device. In particular, the present invention relates to techniques for controlling access to semiconductor memory devices, for example non-volatile devices such as Read Only Memory (ROM) devices, Flash devices, etc, or volatile devices such as Static Random Access Memory (SRAM), Dynamic RAM (DRAM), etc.

2. Description of the Prior Art

In such memory devices, a memory array is provided having a plurality of memory cells. Typically, the memory cells are arranged into a number of rows and columns, with the memory cells in a particular row being connected to a word line, and the memory cells in a particular column being connected to a bit line or a pair of bit lines.

In such memory devices, it is known to provide a number of redundant rows in order to increase yield. In particular, if it is determined that a particular row is faulty, then one of the redundant rows can be used in place of that faulty row. Typically, a storage is provided for keeping a record of any faulty rows, and the redundant row that should be used in its place. Such a storage will in particular keep a record of the address associated with each faulty row and an implicit or explicit identification of the redundant row to be used in place of that faulty row. The storage maintaining this information may in one embodiment take the form of one or more fuse or soft registers, a fuse register keeping its stored value after power is turned off, and a soft register losing its stored value after power is turned off.

For a memory device employing such redundant rows, then on receipt of each access request, irrespective of whether that access request specifies a read operation or a write operation, the address specified by that access request will be compared with the record of faulty rows and if it is determined that the specified address is seeking to access a faulty row, then the access will be arranged to proceed with respect to the identified redundant row. Otherwise, the access can proceed with respect to the addressed row. Due to the comparison of the address which needs to take place prior to the access proceeding, it will be appreciated that this gives rise to an increase in the memory access time for memory devices incorporating such redundant rows, when compared with the memory access time of an equivalent memory device not providing such redundant rows.

Hence, whilst it is beneficial to incorporate redundant rows within memory device designs in order to increase yield, it would be desirable to provide an improved access technique which enabled the memory access time to be reduced.

SUMMARY OF THE INVENTION

Viewed from a first aspect, the present invention provides a memory device comprising: a memory array having a plurality of memory regions, each memory region comprising a plurality of rows of memory cells; a plurality of data path access units, each data path access unit being associated with at least one memory region, and being operable to access the memory cells in the associated at least one memory region; each memory region having at least one associated memory region selected from said plurality of memory regions such that the data path access unit associated with that memory region is different to the data path access unit associated with the at least one associated memory region; the memory array providing a plurality of redundant rows for use in place of any faulty row in the memory array, for each memory region any redundant row used in place of a faulty row in that memory region being provided in said at least one associated memory region; storage for maintaining a record identifying each faulty row and the redundant row to be used in place of that faulty row; control logic operable for a read access request specifying a read address to cause a lookup operation to be performed in order to obtain read data, the lookup operation being performed in both the memory region identified by that read address and the at least one associated memory region; the control logic further comprising comparison logic for performing a comparison operation to determine with reference to said storage whether said read address corresponds to one of said faulty rows as identified in said record; the control logic further being operable to cause to be output the read data obtained from the memory region identified by said read address if the comparison operation determines that said read address does not correspond to one of said faulty rows, but otherwise to cause to be output the read data obtained from the associated memory region containing the redundant row identified in said record.

In accordance with the present invention, the memory array has a plurality of memory regions, and a plurality of data path access units are provided for accessing the memory cells within the memory array, each data path access unit being associated with at least one memory region. For each memory region, any redundant row used in place of a faulty row in that memory region is provided in at least one associated memory region, and the at least one associated memory region is chosen such that the data path access units used by a memory region and its at least one associated memory region are different.

Storage is then provided for maintaining a record identifying each faulty row and the redundant row to be used in place of that faulty row. In one embodiment, the storage comprises a plurality of registers, and each register is associated with a particular redundant row such that for the faulty row identified in that register, the redundant row to be used in place of that faulty row is predetermined. However, alternatively the storage may be arranged such that each entry identifies in a first field the faulty row and in an additional field the redundant row.

When a read access request occurs, control logic causes a lookup operation to be performed in both the addressed memory region and the at least one associated memory region. In addition, comparison logic performs a comparison operation to determine with reference to the storage whether the read address specified by the read access request corresponds to one of the faulty rows. Thereafter, if the comparison operation determines that the read address does not correspond to one of the faulty rows, the data obtained from the addressed memory region is output as the read data, whereas otherwise the data obtained from the identified redundant row in the associated memory region is output as the read data.

Through use of the present invention, there is no need to determine whether the address specified by the read access request corresponds to one of the faulty rows before the lookup can take place. Instead, due to the fact that both the memory region and the at least one associated memory region employ different data path access units, the lookup operation can be performed within the memory region and the at least one associated memory region at the same time and then the data obtained from one of those memory regions can be output as the read data dependent on the result of the comparison operation. This can significantly reduce the time taken for performing read accesses.

In many implementations, read accesses take longer than write accesses, and accordingly by providing a technique which enables the time taken to perform a read access to be reduced, this can enable the clock frequency used to drive the memory device to be increased. Accordingly, the approach of the present invention can enable a reduction in the access time required to access a memory device of the type providing redundant rows in order to increase yield.

There are a number of ways in which the control logic can manage the lookup operation and the comparison operation. In one embodiment, the control logic is operable on receipt of the read access request to independently trigger both the comparison operation and the lookup operation. Hence, the comparison operation and the lookup operation are in such embodiments performed independently of each other, and the timing of either operation is not dependent on the timing of the other operation. In one particular embodiment, the comparison operation is performed in parallel with the lookup operation, and hence for example both operations may be started at the same time.

Whilst in some embodiments, each memory region may have more than one associated memory region, in one embodiment each memory region has one associated memory region. Accordingly, in such embodiments, for any particular memory region, the one or more redundant rows provided for that memory region will be provided in the one associated memory region. This leads to a simplification in the design. In one embodiment, the plurality of memory regions are paired, such that each memory region in the pair acts as the associated memory region for the other memory region in the pair. This has been found to provide a particularly efficient implementation.

The number of redundant rows provided for each memory region can vary dependent on implementation. In one embodiment, a single redundant row is provided for each memory region and hence in the embodiment where the plurality of memory regions are paired, it will be appreciated that each memory region will provide one redundant row which will act as a redundant row for any faulty row in the other memory region of the pair.

There are a number of ways in which each faulty row can be identified in the storage. In one embodiment a unique address for the faulty row can be stored distinguishing it from any other row in the memory array. In one particular embodiment, each faulty row in the storage is identified by a row identifier and a region identifier. Hence in this embodiment the row identifier may be an address portion that does not uniquely identify the row, and the region identifier is then used in combination with that address portion to uniquely identify the row. As an example, if the memory array consists of eight regions, each region having 32 rows, the row identifier may comprise five bits and the region identifier a further three bits. Thus if region 0 provides a redundant row that can be used for any of multiple regions (i.e. region 0 is the "associated memory region" for more than one memory region), the entry in the storage associated with that redundant row can be provided with a five bit address value identifying a row address within a region, and a three bit region address identifying the region in which that faulty row resides. For embodiments where the memory regions are paired, the region identifier need not be explicitly provided in the storage as it can be implied.

The memory regions may take a variety of forms. However, in one embodiment, each memory region comprises a memory bank, and accordingly the memory array consists of multiple memory banks. The techniques of embodiments of the present invention have been found to be particularly effective when used in banked memory devices.

In one embodiment, write access requests can continue to be handled in the standard manner, and accordingly on receipt of a write access request, a comparison will be performed by the comparison logic to determine whether the write address corresponds to one of the faulty rows identified in the storage, and dependent on the outcome of that comparison, the write operation will then proceed with respect to the addressed memory region (if the comparison operation yields no match) or with respect to a particular redundant row (if the comparison operation detects a match). Since as mentioned earlier the actual time taken to perform a write operation is in many implementations less than the time taken to perform a read operation, there is more time in the clock cycle to perform the comparison operation, and in particular in some embodiments there will be time for this comparison operation and the write operation to be performed sequentially within the clock cycle period.

However, in an alternative embodiment, the memory device further comprises: a write register operable for a write access request specifying a write address and write data to buffer said write address and write data; said comparison logic being operable to perform said comparison operation to determine with reference to said storage whether said write address corresponds to one of said faulty rows as identified in said record; the write register being operable to output the buffered write address and write data for storage in the memory region identified by said write address if the comparison operation determines that said write address does not correspond to one of said faulty rows, but otherwise to output the buffered write address and write data for storage in the associated memory region containing the redundant row identified in said record. Hence, in accordance with this embodiment, the processing of a write access request is pipelined such that the write address and write data (and typically any associated control data) are buffered in the write register and then in a subsequent clock cycle are stored into the memory array. Prior to the data actually being written to the memory array, the comparison operation is performed to determine whether the data should be written to the addressed memory region, or instead should be written to a particular redundant row identified in the storage. By such an approach, this can reduce any timing constraints on write accesses.

The point at which the write register is arranged to output the buffered write address and write data for storage in the memory array can vary dependent on embodiment. However, in one embodiment, the write register is operable to output the buffered write address and write data on receipt of a subsequent write access request specifying a subsequent write address and write data to be buffered. Hence, it is the actual receipt of a subsequent write access request that causes the preceding write access request to complete. This provides a particularly efficient mechanism for handling write access requests.

In one such embodiment, the comparison logic is further operable to determine if the read address specified by the read access request is the same as the write address currently buffered in the write register, and if so to cause to be output as the read data the write data currently buffered in the write register. Hence, by such an approach, if a read access request is issued seeking to access an address that is the subject of a preceding write access request which has not yet been completed with respect to the memory array, the comparison logic detects that situation, and causes the write data currently buffered in the write register to be output as the read data.

The memory device of embodiments of the present invention may be either single ported or multi-ported. In one embodiment, the memory device has a single port for allowing one access request to be processed each clock cycle. Hence, in such an embodiment, a read operation or a write operation can be performed in each clock cycle.

Viewed from a second aspect, the present invention provides a method of controlling access to a memory device, the memory device comprising: a memory array having a plurality of memory regions, each memory region comprising a plurality of rows of memory cells; a plurality of data path access units, each data path access unit being associated with at least one memory region, and being operable to access the memory cells in the associated at least one memory region; each memory region having at least one associated memory region selected from said plurality of memory regions such that the data path access unit associated with that memory region is different to the data path access unit associated with the at least one associated memory region; the memory array providing a plurality of redundant rows for use in place of any faulty row in the memory array, for each memory region any redundant row used in place of a faulty row in that memory region being provided in said at least one associated memory region; and storage for maintaining a record identifying each faulty row and the redundant row to be used in place of that faulty row; the method comprising the steps of: for a read access request specifying a read address, performing a lookup operation in order to obtain read data, the lookup operation being performed in both the memory region identified by that read address and the at least one associated memory region; performing a comparison operation to determine with reference to said storage whether said read address corresponds to one of said faulty rows as identified in said record; and outputting the read data obtained from the memory region identified by said read address if the comparison operation determines that said read address does not correspond to one of said faulty rows, but otherwise outputting the read data obtained from the associated memory region containing the redundant row identified in said record.

When designing memory devices, there are two general approaches that can be taken. In accordance with the first approach, the memory device can be custom designed for a particular implementation, which can lead to an efficient design. However, the disadvantage of such an approach is that there is little chance of re-using that design in different implementations and accordingly such an approach is costly. In accordance with an alternative approach, a memory architecture is developed, and then a memory compiler tool is used to create an instance (i.e. a particular instantiation) of that memory architecture to form the design of a required memory device having regard to some required properties of that memory device.

In accordance with a third aspect of the present invention, the present invention provides a computer program storage medium storing a memory compiler computer program for controlling a computer to generate an instance of a memory device from a multi-region memory architecture associated with the memory compiler computer program, the multi-region memory architecture specifying a definition of circuit elements and data defining rules for combining those circuit elements, such that said instance generated specifies a memory device in accordance with the first aspect of the present invention. Hence, in accordance with this aspect of the present invention, a memory compiler tool is provided for generating a design of a memory device that enables a memory device in accordance with the first aspect of the present invention to be produced.

Viewed from a fourth aspect the present invention provides a memory device comprising: a memory array means having a plurality of memory regions, each memory region comprising a plurality of rows of memory cell means; a plurality of data path access means, each data path access means being associated with at least one memory region, and for accessing the memory cell means in the associated at least one memory region; each memory region having at least one associated memory region selected from said plurality of memory regions such that the data path access means associated with that memory region is different to the data path access means associated with the at least one associated memory region; the memory array means providing a plurality of redundant rows for use in place of any faulty row in the memory array means, for each memory region any redundant row used in place of a faulty row in that memory region being provided in said at least one associated memory region; storage means for maintaining a record identifying each faulty row and the redundant row to be used in place of that faulty row; control means responsive to a read access request specifying a read address to cause a lookup operation to be performed in order to obtain read data, the lookup operation being performed in both the memory region identified by that read address and the at least one associated memory region; the control means further comprising comparison means for performing a comparison operation to determine with reference to said storage means whether said read address corresponds to one of said faulty rows as identified in said record; the control means further arranged to cause to be output the read data obtained from the memory region identified by said read address if the comparison operation determines that said read address does not correspond to one of said faulty rows, but otherwise to cause to be output the read data obtained from the associated memory region containing the redundant row identified in said record.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
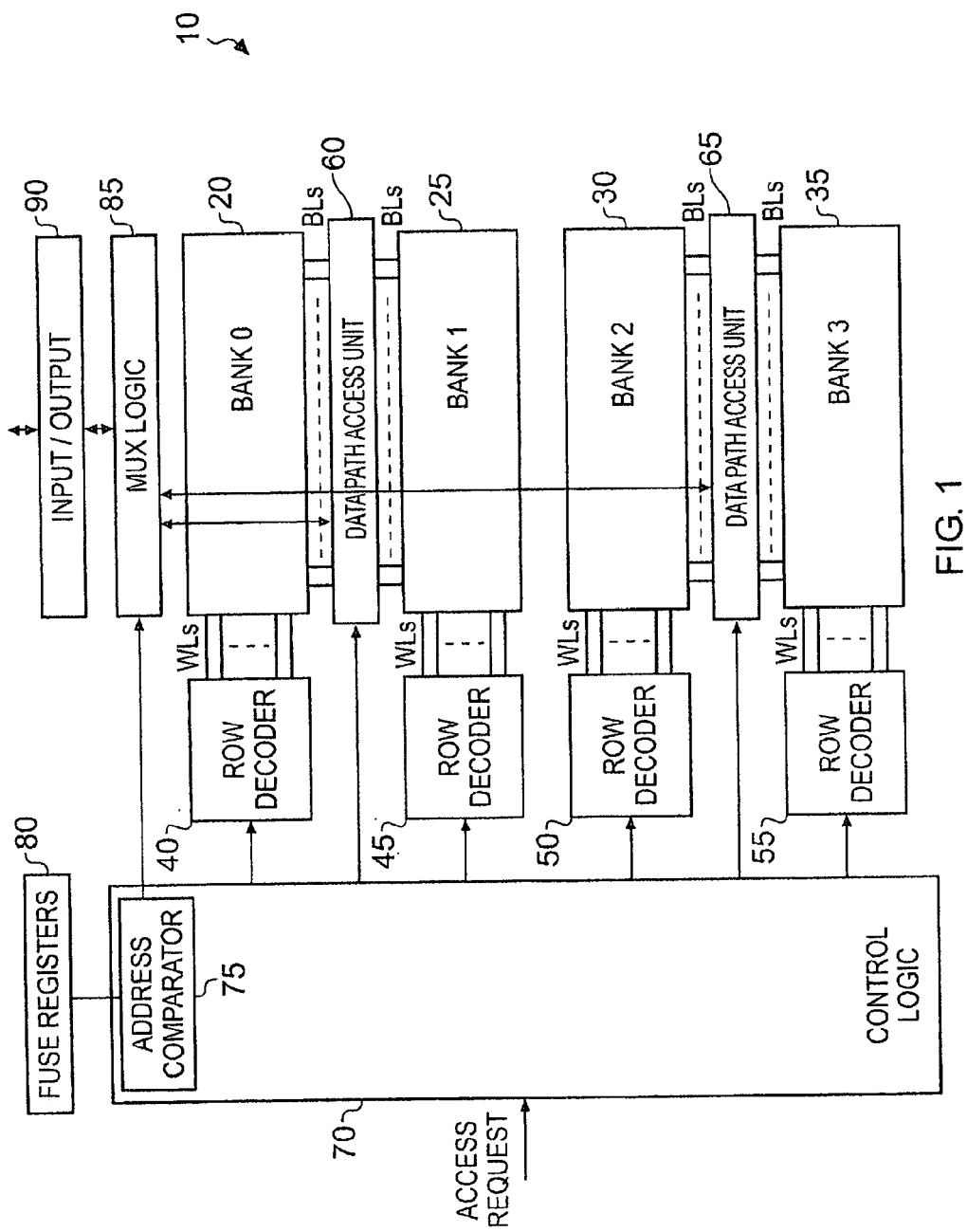
FIG. 1 is a block diagram of a memory device in accordance with one embodiment of the present invention.

FIG. 1 is a block diagram of a memory device 10 constructed in accordance with a banked memory architecture.

More particularly, as shown in FIG. 1, the memory device 10 has a memory array consisting of four banks 20, 25, 30, 35, each bank containing a number of rows and columns of memory cells.

The operation of the memory device 10 is controlled by control logic 70 which is arranged to receive each access request directed to the memory device 10. Such an access request may be a read access request seeking to read a data value from memory, or may be a write access request seeking to write a data value to memory. The data values the subject of access requests may be of various sizes, dependent on embodiment, and hence for example may be a byte, a half word, a word, etc.

As shown in FIG. 1, each bank 20, 25, 30, 35 has an associated row decoder 40, 45, 50, 55 for driving individual word lines (WLs) connected to each row within the bank. Further, data path access units 60, 65 are provided for reading data values from addressed cells and writing data values to addressed cells. Hence, with respect to the read data path, each data path access unit 60, 65 contains a multiplexer for receiving at its inputs the signals output by each of the bit lines connected to cells in an addressed word line, the multiplexer being arranged dependent on an address signal it receives from the control logic 70 to route the signals on the bit lines associated with the addressed data value to sense amp circuitry used to detect from those signals the values stored in the relevant memory cell(s) containing the addressed data value.

Conversely, for write access requests, each data path access unit 60, 65 contains write driver circuitry for causing the write data to be stored into the addressed cell(s) of the relevant memory bank 20, 25, 30, 35 dependent on the write address provided from the control logic 70, as being appreciated by those skilled in the art this typically being done by manipulation of the voltages on the relevant bit lines (BLs).

It will be seen from FIG. 1 that the data path access unit 60 is shared with bank zero 20 and bank one 25, whilst the data path access unit 65 is shared with bank two 30 and bank three 35. In an alternative embodiment, each bank may be provided with its own separate data path access unit.

In accordance with embodiments of the present invention, the memory array provides a plurality of redundant rows which are spread out amongst the various banks, 20, 25, 30, 35. In particular, a number of redundant rows are provided in each memory bank, and each memory bank is arranged to have an associated memory bank selected from the four available memory banks such that if a faulty row is detected in any particular memory bank, it can be replaced by a redundant row provided in the associated memory bank.

In accordance with embodiments of the present invention, the choice of the associated memory bank for any particular memory bank is made such that a memory bank and its associated memory bank will not use the same data path access unit 60, 65. Hence, by way of example, in the memory device 10 shown in FIG. 1, the associated memory bank for bank zero 20 may be either bank two 30 or bank three 35. In one embodiment, some of the redundant rows for bank zero may be placed in bank two 30 and other of the redundant rows may be provided in bank three 35. However, in one embodiment, there is only one associated memory bank for each memory bank, and accordingly any redundant rows for bank zero 20 will be provided in one of either bank two 30 or bank three 35. In one particular embodiment, there is only a single redundant row provided for each bank.

In association with the memory device 10, some storage is provided for maintaining a record identifying each faulty row and the redundant row to be used in place of that faulty row. In FIG. 1, this storage takes the form of a number of fuse registers 80, fuse registers being registers that retain their value once the power is turned off. Typically, these fuse registers are populated at production time, when some post production tests are performed to identify any faulty rows. In an embodiment where a single redundant row is provided for each bank, then it will be appreciated that four fuse registers 80 can be provided for a memory device having four banks, one being associated with each redundant row and identifying an address of a particular row in a bank that should be mapped to that redundant row. Since in such embodiments, the relationship between a particular fuse register and a particular redundant row is hard-wired, the identification of the redundant row to be used in place of a faulty row identified in a particular fuse register is predetermined.

In one particular embodiment, the various memory banks are paired for the purposes of defining redundant rows, such that each memory bank in the pair acts as the associated memory bank for the other memory bank in the pair. Hence, by way of illustration with reference to FIG. 1, banks zero and two may be paired and banks one and three may be paired. Hence, for a fuse register associated with a particular redundant row, it is not only known implicitly what redundant row is to be used for the faulty row identified in that fuse register, but it is also known in which bank the faulty row identified in the fuse register will reside. As an example, considering a particular fuse register associated with a redundant row in bank two, it will be known (assuming the earlier mentioned example) that any faulty row identified in that fuse register will be a faulty row in bank zero. Accordingly, it is not actually necessary to store the entire address within the fuse register in such embodiments. For example, if each bank has 32 rows, then five address bits are required to uniquely identify each of the rows in a particular bank. A further two address bits are required to identify the relevant bank, given the four banks shown in the memory device 10 of FIG. 1. In embodiments where the memory banks are paired, it will only be necessary in the above example to store five address bits in each fuse register since it is already known which bank the faulty row identified by the entry in the fuse register resides in.

In addition to fuse registers which are programmed at production time, and retain their values after the power is turned off, details about defective rows can also be stored in soft registers, which are programmed each time the power is turned on to the device, typically by some built-in self test (BIST) routine initiated at that time. As with fuse registers, particular soft registers can be directly associated with particular redundant rows, and hence for a faulty row identified in a particular soft register, it is implicitly known which redundant row is to be used in place of that faulty row.

It will be appreciated that in a more general embodiment, each of the registers making up the storage that maintains a record identifying each faulty row may be used to identify any faulty row in the memory array, and to explicitly identify the redundant row to be used in its place. In such instances each register would include a first field for specifying the address (or at least an address portion) identifying the faulty row, and an additional field identifying the location of the redundant row to be used in its place.

As shown in FIG. 1, the input/output interface 90 of the memory device is coupled with the data path access units 60, 65 by multiplexer logic 85 which is controlled dependent on a signal produced by an address comparator 75 within the control logic 70. The operation of the multiplexer logic 85 and the address comparator 75 will now be described in more detail.

When any read access request is received by the control logic 70, the read address specified in the read access request is used to determine the bank in which the required data value resides, and to cause an appropriate control signal to be sent to the relevant row decoder 40, 45, 50, 55, that row decoder causing the word line holding that data value to be activated so as to allow the relevant memory cell(s) to be read. At the same time, the control logic 70 also causes the appropriate control signal to be sent to the row decoder of the associated memory bank used to contain any redundant rows for the addressed memory bank, so as to cause data to be read from the relevant redundant row. In one embodiment of the present invention, there is only a single redundant row for each memory bank, and accordingly it is immediately known which word line in the associated memory bank to activate. However, if more than one redundant row is provided, then the control logic 70 will need to retain a mapping identifying for any particular group of word lines in the addressed memory bank, the relevant redundant row in the associated memory bank.

Since the memory banks are paired such that the two banks in each pair do not share the same data path access units 60, 65, both of these read operations can take place in parallel, with the outputs from the relevant data path access units being forwarded to the multiplexer logic 85.

Whilst the lookup is being performed in both the addressed memory bank and the relevant redundant row in the associated memory bank, the address comparator 75 is arranged to compare the read address with the addresses stored in the relevant fuse registers 80 (and/or soft registers if any such soft registers are provided). If the address is found to match the address in the relevant register(s) 80, then a control signal is sent from the address comparator 75 to the multiplexer logic 85 to cause it to select for output to the input/output interface 90 the data value read from the redundant row of the associated memory bank. Conversely, if no match is detected by the address comparator, then a control signal is sent to the multiplexer logic 85 to cause it to output to the input/output interface 90 the data value read from the originally addressed memory bank.

Since the address comparison can be done in parallel with the read operation performed in respect of both the addressed memory bank and the redundant row of the associated memory bank, this yields a significant performance improvement when compared with the typical prior art approach, where the address comparison has to occur first in order to decide whether the read operation should be performed in respect of the originally addressed memory row, or instead in respect of the redundant row.

In one embodiment, write operations can still be handled in the standard manner, where on receipt of a write access request, the address comparator 75 is arranged to determine with reference to the relevant fuse or soft registers 80 whether the write address matches any of the faulty rows, and thereafter if a match is detected to cause the write to proceed with respect to the relevant redundant row, and if no match is detected to cause the write to proceed with respect to the row identified by the write address. Typically, the actual act of writing to a memory bank is quicker than the act of reading from a memory bank, and accordingly there is more time in a given clock cycle for the address comparison performed in respect of a write operation.

However, in an alternative embodiment, to remove any time constraints on write accesses, the write operation is arranged to be pipelined, such that the write address, write data and associated control information of each write access request is initially buffered in a write register within the control logic 70, and is only actually committed to the memory array once the next write access request is received. In the intervening time, the required address comparison can be performed by the address comparator 75.

The read and write operations performed in accordance with embodiments of the present invention will now be described in more detail with reference to FIG. 2.

Figure 2:
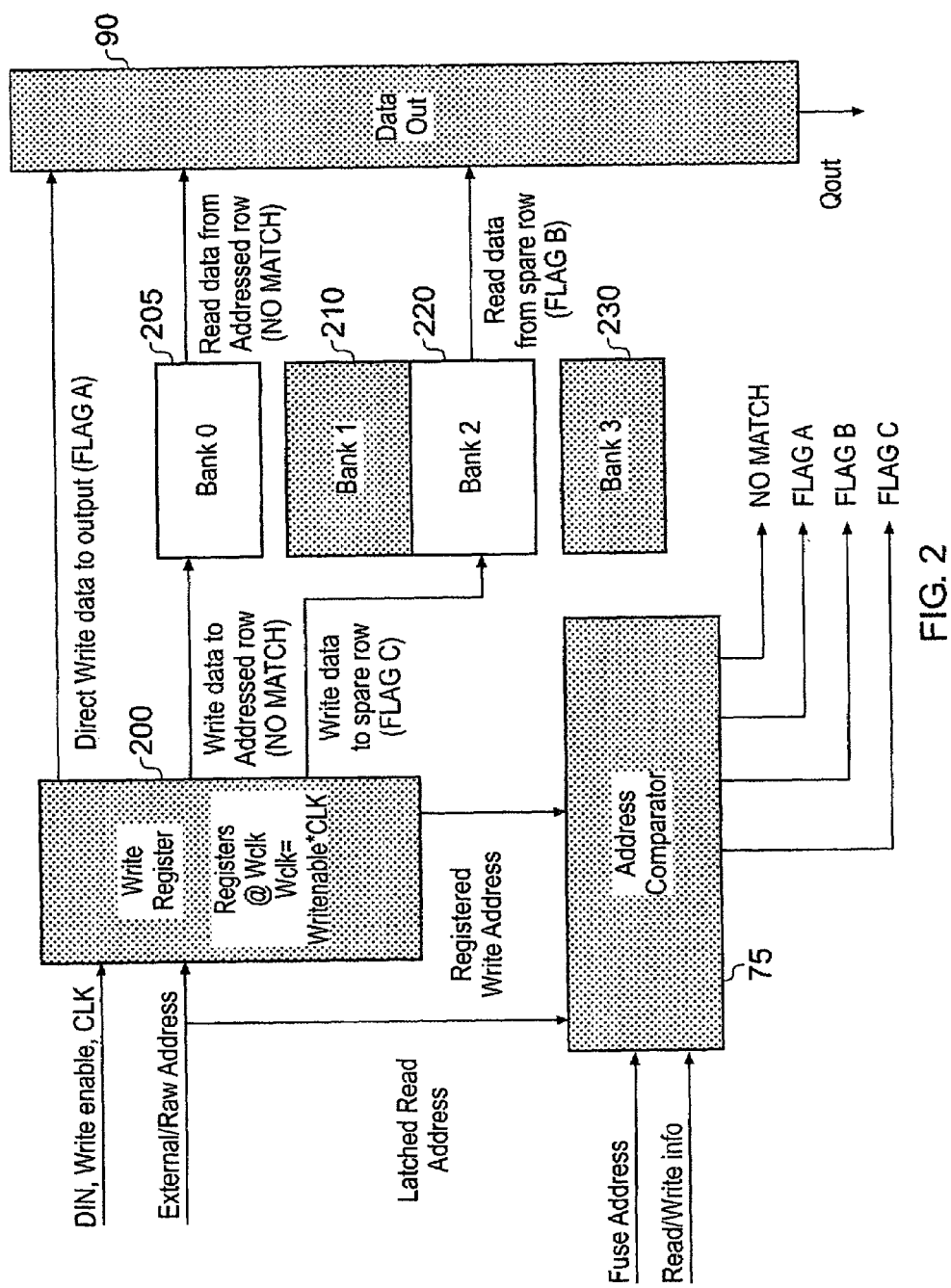
FIG. 2 is a diagram schematically illustrating how read and write access requests are processed by the memory device of FIG. 1 in accordance with one embodiment of the present invention.

In FIG. 2 the above-mentioned write register 200 is shown, and is arranged to receive any data in (DIN) and write enable signal associated with a write access request, along with a clock signal used by the memory device. The write register 200 is also connected to the address line so as to receive any write addresses. On the rising edge of a W clock (Wclk) signal (which is triggered by the rising edge of the normal clock signal at a time where the write enable signal is asserted), the write register 200 is arranged to output its current contents (pertaining to a previous write access request) and store into the write register the write address, write data and associated control information pertaining to a new write access request.

The address comparator 75 is arranged to receive either a registered write address from the write register 200 (in the event of a write access request), or a latched version of the read address ("Latched Read Address") for a read access request, and also receives a control signal ("Read/Write Info") identifying whether the current access is a read access or a write access. This control signal hence identifies which of the two input address values to the address comparator 75 should be compared with the address or addresses ("Fuse Address") provided in the relevant fuse registers 80. Dependent on the result of the comparison, the address comparator 75 outputs one of four signals, namely a no match signal, flag A, flag B or flag C. The following defines when each of these four signals is produced:

If (External/Raw Address=Registered Write Address, read cycle)
FLAG A=YES<Read directly from write register>
If (External/Raw Address=FUSE Address, read cycle)
FLAG B=YES<Read from associated bank>
If (Registered Write Address=Fuse Address, write cycle)
FLAG C=YES<Write into associated bank>
If (NO MATCH)
Read/Write in the Master Bank.

Accordingly, if for a read access request the provided read address matches the registered write address in the write register 200, then flag A is set. As shown in FIG. 2, if flag A is set, this causes the write data buffered in the write register 200 to be output to the data output circuit 90 ("Direct Write data to output (FLAG A)"). Accordingly, in situations where the address comparator determines that the current read access request is seeking to access data at the address of a preceding write access request which has not yet been committed to the memory array, it causes the current write data in the write register to be output as the required read data.

Alternatively, if the address comparator 75 determines for a read access request that the read address corresponds to one of the addresses stored in the fuse registers, it sets flag B, so as to cause the read data to be output from the spare, redundant row ("Read data from spare row (FLAG B)"). In the example illustrated in FIG. 2, it is assumed that the row being addressed is in bank zero 205, and bank two 220 provides the redundant row. In FIG. 2, the elements identified as bank zero 205, bank one 210, bank two 220 and bank three 230 are a schematic illustration, and include all of the associated row decoder circuitry, data path access unit circuitry, and the multiplexer circuitry controlled by the signals produced by the address comparator 75.

If the address comparator 75 determines no match for the read address, then this causes the read data to be output from the addressed row (in this example a row within bank zero 205) ("Read data from Addressed row (NO MATCH)"). The read data provided to data output circuit 90 is then output as data Qout.

Considering write accesses, if the address comparator 75 determines that the registered write address provided by the write register 200 corresponds to one of the addresses in the fuse register, then it issues flag C, which causes the write data currently buffered in the write register 200 to be written to the spare, redundant row ("Write data to spare row (FLAG C)") at the time the next write access request is received (in this example the redundant row being in bank two 220). If no match is detected for the write access request, then the write data is output from the write register 200 to the originally addressed row (in this example the row being in bank zero 205) when the next write access request is received ("Write data to Addressed row (NO MATCH)").

Figure 3:
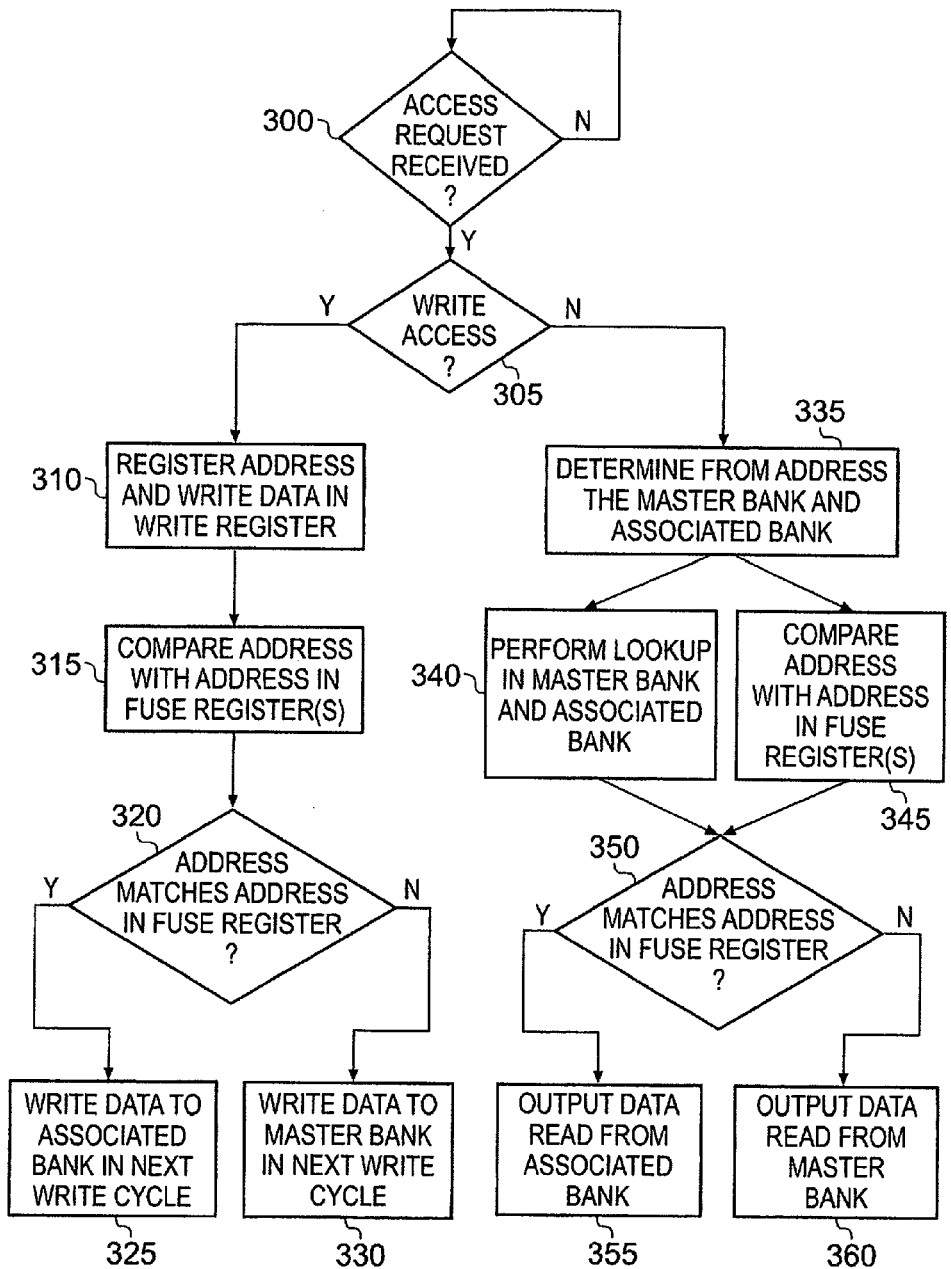
FIG. 3 is a flow diagram illustrating the process performed by the memory device of one embodiment of the present invention in order to process read and write access requests.

FIG. 3 is a flow diagram schematically illustrating the above described steps. Accordingly, at step 300 the control logic 70 determines whether an access request has been received. When an access request is received, it is then determined at step 305 whether the access is a write access, and if so the process branches to step 310, where the write address and write data are buffered in the write register 200, along with associated control information. Thereafter, at step 315, the address comparator 75 compares the write address stored in the write register with the address or addresses in the relevant fuse register(s) 80. If an address match is detected at step 320, then the process branches to step 325, where the write data is written to the associated bank in the next write cycle, as indicated by the Wclk signal. If no address match is detected at step 320, then the write data is written to the master bank in the next write cycle at step 330.

Returning to step 305, if it is determined that the access request is a read access request, then at step 335 the control logic 70 determines from the read address the master bank and the associated bank. Thereafter, steps 340 and 345 are performed in parallel. At step 340, a lookup is performed in the master bank and the associated bank, and in particular in the row of the master bank indicated by the read address, and in the row of the associated bank containing the redundant row for the master bank. At the same time, at step 345, the read address is compared with the address or addresses in the relevant fuse register or fuse registers.

At step 350, it is then determined whether the address of the read access request matches an address in the relevant fuse register(s) 80, and if so the process branches to step 355, where the data read from the associated bank is output as the required read data. If no match is detected, then the process branches to step 360, where the data read from the master bank is output as the read data.

Figure 4A:
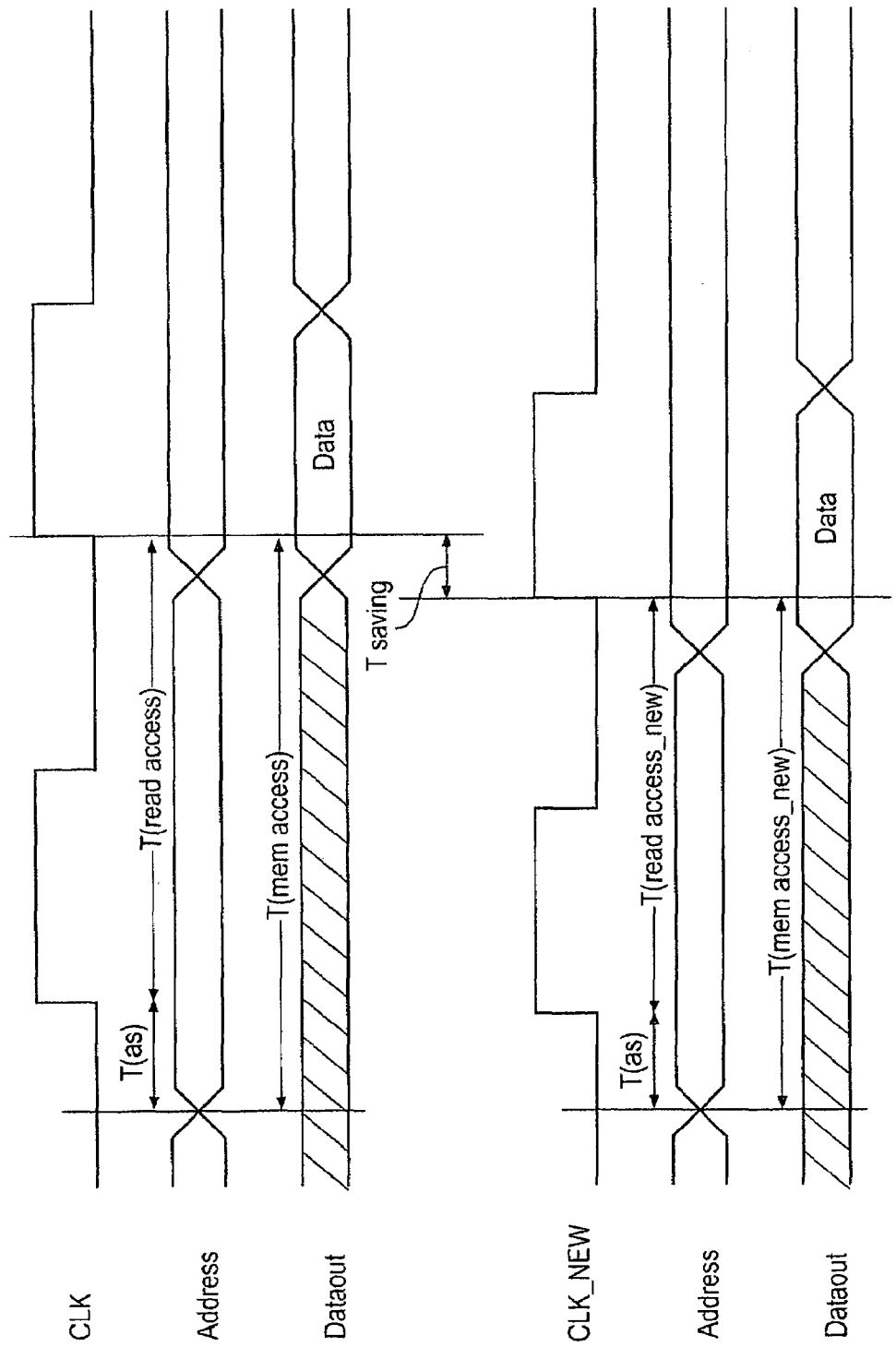
FIGS. 4A and 4B are timing diagrams comparing the timings of a read access request in accordance with a prior art technique and in accordance with the technique of embodiments of the present invention.
Figure 4B:
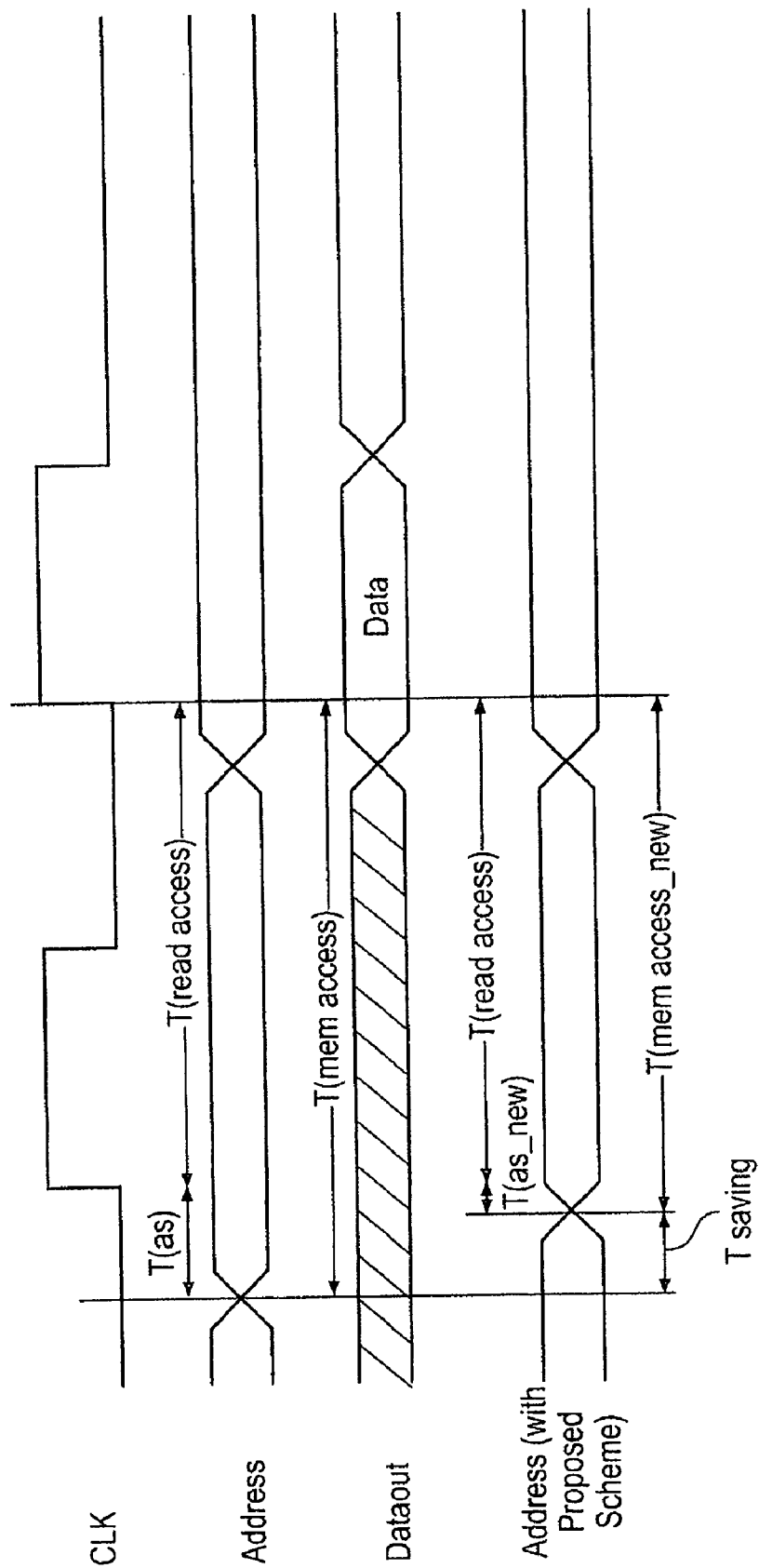

FIGS. 4A and 4B are timing diagrams comparing the access time required to process a read access request in accordance with a prior art technique, and in accordance with the technique of embodiments of the present invention, both techniques causing the read data ("Data") to be output as a "Dataout" signal. A memory access involves both an address setup stage taking time T(as) and a read access stage taking time T(read access). When including row redundancy the additional comparison operation required can be considered either as part of the address setup stage or as part of the read access stage. Considering first FIG. 4A, this compares the timing of the prior art technique and the technique of embodiments of the present invention assuming the comparison operation is viewed as part of the read access stage. The read access stage in accordance with the prior art technique involves the comparison operation followed by the lookup operation. However, in accordance with techniques of embodiments of the present invention the comparison operation is performed in parallel with the lookup operation, thereby reducing the time of the read access stage to T(read access_new). Hence the clock speed can be increased to CLK_NEW, resulting in the memory access time being T(mem access_new), which is reduced with respect to the prior art memory access time T(mem access). Hence, as is clear from FIG. 4A, when employing the technique of embodiments of the present invention, the access time is significantly reduced, as indicated by the time Tsaving in FIG. 4A (the time saving resulting from the parallel comparison mentioned above).

FIG. 4B is a similar diagram, but compares the timing of the prior art technique and the technique of embodiments of the present invention assuming the comparison operation is viewed as part of the address setup stage in the prior art technique. Again, both techniques cause the read data ("Data") to be output as a "Dataout" signal. As can be seen from FIG. 4B the effective address setup time is reduced to T(as_new) because the read access can start without waiting for the comparison operation to be performed, i.e. the part of the address setup stage in which the comparison operation is performed takes place in parallel with the read access stage. As can be seen from a comparison of the "Address (with Proposed Scheme)" signal line with the prior art "Address" signal line, the address signal needs to be asserted for less time than is the case for the prior art technique, thereby giving rise to improved timing, as indicated by the time Tsaving in FIG. 4B (due to parallel comparison, time in comparing the address is not required).

Whilst in one embodiment, the memory device 10 shown in FIG. 1 may be a custom designed memory device for a particular implementation, in an alternative embodiment the design of such a memory device 10 may be generated by a memory compiler tool, which is run to create an instance of a banked memory architecture to form the design of the memory device 10. A banked memory architecture used by the compiler tool will typically specify a definition of circuit elements and data defining rules for combining those circuit elements. In accordance with such an embodiment of the present invention, the definition of the circuit elements will include amongst other things a definition of the write register 200, the multiplexer logic 85, the address comparator 75, etc, in addition to all of the other usual circuit elements used to produce the memory device 10. The rules for combining circuit elements will then specify that the redundant row(s) for a particular bank should be provided in an associated bank which does not share data path access unit circuitry. Accordingly, when the memory compiler is run to create an instance of the specified banked memory architecture, it can be used to produce a design for a memory device such as the memory device 10 described in FIG. 1, thereby enabling particular instances of the banked memory architecture to be produced which will allow the read and write access speed benefits described above to be achieved.

Figure 5:
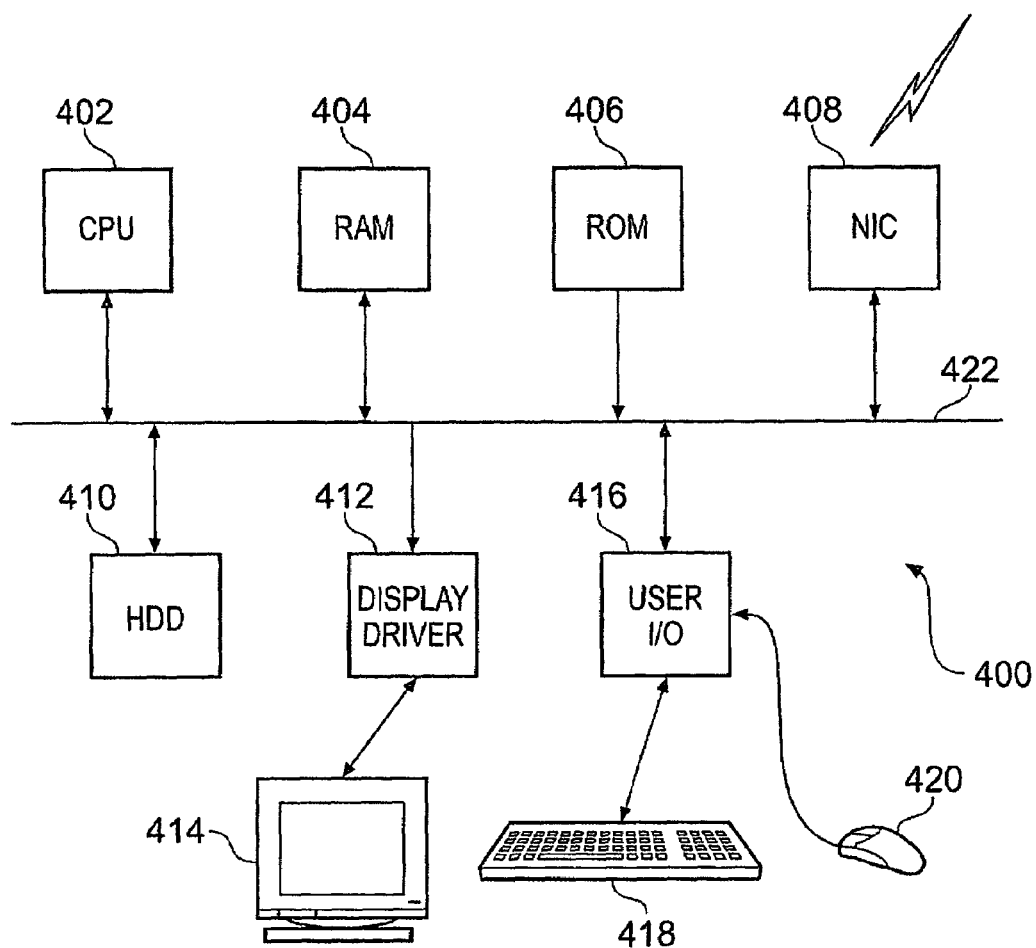
FIG. 5 is a diagram of a computer system on which a memory compiler computer program in accordance with one embodiment of the present invention can be run in order to generate a design for a memory device that will handle read and write access requests in accordance with embodiments of the present invention.

FIG. 5 schematically illustrates a general purpose computer 400 of the type that may be used to run the above described memory compiler tool. The general purpose computer 400 includes a central processing unit 402, a random access memory 404, a read only memory 406, a network interface card 408, a hard disc drive 410, a display driver 412 and monitor 414 and a user input/output circuit 416 with a keyboard 418 and mouse 420 all connected via a common bus 422. In operation, the central processing unit 402 will execute computer program instructions that may be stored in one or more of the random access memory 404, the read only memory 406 and the hard disc drive 410, or dynamically downloaded via the network interface card 408. The results of the processing performed may be displayed to a user via the display driver 412 and the monitor 414. User inputs for controlling the operation of the general purpose computer 400 may be received via the user input/output circuit 416 from the keyboard 418 or the mouse 420 (and hence for example input parameters used to determine certain properties of the required memory device can be entered via this mechanism). It will be appreciated that the computer program could be written in a variety of different computer languages. The computer program may be stored and distributed on a recording medium or dynamically downloaded to the general purpose computer 400. When operating under control of an appropriate computer program, the general purpose computer 400 can hence be arranged to execute a memory compiler tool in order to generate an instance of a banked memory architecture that can be used as the design for a memory device such as the memory device 10 shown in FIG. 1 and described above with reference to FIGS. 1 to 4. The architecture of the general purpose computer 400 could vary considerably and FIG. 5 is only one example.

From the above description of embodiments of the present invention, it will be appreciated that such techniques enable read access time in memory devices providing row redundancy to be reduced by physically keeping a redundant row corresponding to a faulty row in a bank in another bank having a separate data path. For a read access request, both an addressed row and a redundant row can be accessed at the same time, whilst an address comparison takes place in parallel, such that the read data from one of the two accessed rows can then be selected and provided at the output. Optionally, write operations can be arranged to be performed in a pipelined manner, through use of a write register, such that for write operations there is no access time penalty resulting from the use of redundant rows. Hence, when designing memory devices in a technology where read access timing is critical, use of the read technique of embodiments of the present invention will decrease the overall access time. In technologies where write access timing is also becoming critical (in some emerging technologies write access time can actually be greater than read access time), the use of the pipelined write technique of embodiments of the present invention can be used to alleviate the timing constraints.

Whilst the use of techniques of embodiments of the present invention give rise to some additional costs in terms of area required to provide the multiplexing logic 85, the write register 200, etc, this is more than outweighed by the reductions in access time that can be achieved through use of such techniques. The techniques of embodiments of the present invention can be applied to a wide variety of different types of memory devices, and hence for example may be used in ROM devices, Flash devices, SRAM devices, DRAM devices, etc.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. A memory device comprising:
   a memory array having a plurality of memory regions, each memory region comprising a plurality of rows of memory cells;
   a plurality of data path access units, each data path access unit being associated with at least one memory region, and being operable to access the memory cells in the associated at least one memory region;
   each memory region having at least one associated memory region selected from said plurality of memory regions such that the data path access unit associated with that memory region is different to the data path access unit associated with the at least one associated memory region;
   the memory array providing a plurality of redundant rows for use in place of any faulty row in the memory array, for each memory region any redundant row used in place of a faulty row in that memory region being provided in said at least one associated memory region;
   storage for maintaining a record identifying each faulty row and the redundant row to be used in place of that faulty row;
   control logic operable for a read access request specifying a read address to cause a lookup operation to be performed in order to obtain read data, the lookup operation being performed in both the memory region identified by that read address and the at least one associated memory region;
   the control logic further comprising comparison logic for performing a comparison operation to determine with reference to said storage whether said read address corresponds to one of said faulty rows as identified in said record;
   the control logic further being operable to cause to be output the read data obtained from the memory region identified by said read address if the comparison operation determines that said read address does not correspond to one of said faulty rows, but otherwise to cause to be output the read data obtained from the associated memory region containing the redundant row identified in said record.

2. A memory device as claimed in claim 1, wherein the control logic is operable on receipt of the read access request to independently trigger both the comparison operation and the lookup operation.

3. A memory device as claimed in claim 2, wherein the comparison operation is performed in parallel with the lookup operation.

4. A memory device as claimed in claim 1, wherein each memory region has one associated memory region.

5. A memory device as claimed in claim 4, wherein the plurality of memory regions are paired, such that each memory region in the pair acts as the associated memory region for the other memory region in the pair.

6. A memory device as claimed in claim 1, wherein each faulty row in the storage is identified by a row identifier and a region identifier.

7. A memory device as claimed in claim 1, wherein each memory region comprises a memory bank.

8. A memory device as claimed in claim 1, further comprising:
   a write register operable for a write access request specifying a write address and write data to buffer said write address and write data;
   said comparison logic being operable to perform said comparison operation to determine with reference to said storage whether said write address corresponds to one of said faulty rows as identified in said record;
   the write register being operable to output the buffered write address and write data for storage in the memory region identified by said write address if the comparison operation determines that said write address does not correspond to one of said faulty rows, but otherwise to output the buffered write address and write data for storage in the associated memory region containing the redundant row identified in said record.

9. A memory device as claimed in claim 8, wherein the write register is operable to output the buffered write address and write data on receipt of a subsequent write access request specifying a subsequent write address and write data to be buffered.

10. A memory device as claimed in claim 8, wherein the comparison logic is further operable to determine if the read address specified by the read access request is the same as the write address currently buffered in the write register, and if so to cause to be output as the read data the write data currently buffered in the write register.

11. A memory device as claimed in claim 1, wherein the memory device has a single port for allowing one access request to be processed each clock cycle.

12. A method of controlling access to a memory device, the memory device comprising:
   a memory array having a plurality of memory regions, each memory region comprising a plurality of rows of memory cells;
   a plurality of data path access units, each data path access unit being associated with at least one memory region, and being operable to access the memory cells in the associated at least one memory region;
   each memory region having at least one associated memory region selected from said plurality of memory regions such that the data path access unit associated with that memory region is different to the data path access unit associated with the at least one associated memory region;
   the memory array providing a plurality of redundant rows for use in place of any faulty row in the memory array, for each memory region any redundant row used in place of a faulty row in that memory region being provided in said at least one associated memory region; and
   storage for maintaining a record identifying each faulty row and the redundant row to be used in place of that faulty row;
   the method comprising the steps of:
   for a read access request specifying a read address, performing a lookup operation in order to obtain read data, the lookup operation being performed in both the memory region identified by that read address and the at least one associated memory region;
   performing a comparison operation to determine with reference to said storage whether said read address corresponds to one of said faulty rows as identified in said record; and
   outputting the read data obtained from the memory region identified by said read address if the comparison operation determines that said read address does not correspond to one of said faulty rows, but otherwise outputting the read data obtained from the associated memory region containing the redundant row identified in said record.

13. A computer program storage medium storing a memory compiler computer program for controlling a computer to generate an instance of a memory device from a multi-region memory architecture associated with the memory compiler computer program, the multi-region memory architecture specifying a definition of circuit elements and data defining rules for combining those circuit elements, such that said instance generated specifies a memory device as claimed in claim 1.

14. A memory device comprising:
   a memory array means having a plurality of memory regions, each memory region comprising a plurality of rows of memory cell means;
   a plurality of data path access means, each data path access means being associated with at least one memory region, and for accessing the memory cell means in the associated at least one memory region;
   each memory region having at least one associated memory region selected from said plurality of memory regions such that the data path access means associated with that memory region is different to the data path access means associated with the at least one associated memory region;
   the memory array means providing a plurality of redundant rows for use in place of any faulty row in the memory array means, for each memory region any redundant row used in place of a faulty row in that memory region being provided in said at least one associated memory region;
   storage means for maintaining a record identifying each faulty row and the redundant row to be used in place of that faulty row;
   control means responsive to a read access request specifying a read address to cause a lookup operation to be performed in order to obtain read data, the lookup operation being performed in both the memory region identified by that read address and the at least one associated memory region;
   the control means further comprising comparison means for performing a comparison operation to determine with reference to said storage means whether said read address corresponds to one of said faulty rows as identified in said record;
   the control means further arranged to cause to be output the read data obtained from the memory region identified by said read address if the comparison operation determines that said read address does not correspond to one of said faulty rows, but otherwise to cause to be output the read data obtained from the associated memory region containing the redundant row identified in said record.

* * * * *